(12) United States Patent
Shin

(10) Patent No.: US 6,414,551 B1
(45) Date of Patent: Jul. 2, 2002

(54) MULTI-SPACE STRUCTURE AMPLIFIER

(75) Inventor: Cheon Woo Shin, 13-205, Samick-Apartment, 148 Namcheon-Dong Suyong-Ku, 613-010 Pusan (KR)

(73) Assignees: Sensing Tech Corp.; Cheon Woo Shin, both of Pusan (KR)

( * ) Notice: Subject to any disclaimer, the term of this patent is extended or adjusted under 35 U.S.C. 154(b) by 77 days.

(21) Appl. No.: 09/631,401

(22) Filed: Aug. 3, 2000

(51) Int. Cl.7 ................................................ H03F 3/60
(52) U.S. Cl. ........................ 330/287; 330/56; 330/61 A
(58) Field of Search .......................... 330/54, 56, 61 A, 330/286, 287

(56) References Cited

U.S. PATENT DOCUMENTS 3,818,365 A * 6/1974 Hanson ....................... 330/287
4,016,506 A * 4/1977 Kofol ....................... 330/56 X
6,218,916 B1 * 4/2001 Ishikawa et al. ............ 333/254

* cited by examiner

*Primary Examiner*—Steven J. Mottola
(74) *Attorney, Agent, or Firm*—The Maxham Firm

(57) ABSTRACT

A high frequency amplifier with the multi-space structure, amplifying various frequencies by a Gunn diode in the multi-space structure, composed of non-radiative dielectric waveguides of various different sizes. An amplifier circuit includes a Gunn diode inserted in a space between two metal plates of a certain distance from each other, a circulator which revolves input waves and determines transmission direction, a first non-radiative dielectric waveguide, which is connected to the circulator, sending the input waves from the input terminal to the circulator, a second non-radiative dielectric waveguide, which is connected to the circulator, sending the input signals from the circulator to the Gunn diode and sends the amplified signals from the Gunn diode back to the circulator; and a third non-radiative dielectric waveguide, which is connected to the circulator, sending the amplified signals, which come into the circulator through the second non-radiative dielectric waveguide, to the output terminal.

6 Claims, 7 Drawing Sheets

MULTI-SPACE STRUCTURE AMPLIFIER

BACKGROUND OF THE INVENTION

1. Field of the Invention

The present invention relates to a high frequency amplifier, in particular, the multi-space structure amplifier which may amplify various frequencies through use of the Gunn diode installed in the multi-space structure non-radiative dielectric waveguides of various different sizes.

2. Description of Related Art

As the computer and information communication technologies improve, data amount used by individuals increases accordingly. Furthermore, because of the recent development of multimedia, the formats of information used by individuals are changing from texts of characters to paintings or pictures, and further to motion pictures. Thus, there exists an urgent need to transmit a large quantity of information by real time.

For the above-described reasons, uses of mobile or cellular terminals are steadily increasing and thus the need also increases for a high capacity super-high speed radio communication device which may transmit a large amount of information to such cellular terminals.

Therefore, it is necessary to use high frequency and widened bandwidth and there are acute demands for amplifiers which can process high frequencies and provide broadbands.

A Gunn diode of GaAs material is an element with two conduction band valleys, which may be in a negative resistance state according to the difference in electronic mobility, which is caused by the element's electric field strength.

As the bias voltage is applied to a Gunn diode, two amplification areas and one oscillation area are generated, as illustrated in the graph of FIG. 1. Here, the amplification area at the lower bias voltage level is called "Amplification Area 1" and the amplification area at the higher bias voltage level is called "Amplification Area 2." The Amplification Area 1 at the lower bias voltage is the negative resistance area where the electrons inside of the Gunn diode move from L valley to U valley. Such negative resistance area continues until there is no gain in Amplification Area 2. As the graph illustrates, there are two negative areas in the Gunn diode, but in Amplification Area 1, there is only a very limited scope where the bias voltage may be supplied. Such amplification area may be easily escaped by instability of the bias circuit. Thus, an amplifier may be designed for Amplification Area 2.

An amplifier designed using Amplification Area 2 may have a problem of inability to carry various frequencies, because all the circuit elements constituting the amplifier, such as dielectric waveguides and a strip resonator, are set to resonate in accordance with a certain predetermined frequency.

SUMMARY OF THE INVENTION

In order to solve the above-described problems, the present invention has its object in providing an amplifier with the non-radiative dielectric waveguides, using the amplification characteristics of the Gunn diode.

The non-radiative dielectric waveguide requires the Gunn diode's size to be changed for amplification of a different frequency, because circuit elements must be installed between two metal plates, the space between which is a half the frequency to be used. Another object of the present invention is to provide an amplification function for various frequencies regardless of the size of the Gunn mount, by using the multi-space structure non-radiative dielectric waveguides, in order to overcome problems related to the Gunn diode size.

DETAILED DESCRIPTION OF THE PREFERRED EMBODIMENTS

In accord with the above object, the present invention provides an amplifier circuit with the multi-space structure, comprising: a Gunn diode inserted in a space between two metal plates of a certain distance from each other; a circulator which revolves the input waves and determines the transmission port; the first non-radiative dielectric waveguide which is connected to the circulator, sending the input waves from the input terminal to the circulator; the second non-radiative dielectric waveguide which also is connected to the circulator, sending the input signals from the circulator to the Gunn diode and sending the signals, amplified by a certain ratio, back to the circulator; and the third non-radiative dielectric waveguide which is connected to the circulator, sending the amplified signals, which come into the circulator, to the load side.

The amplifier, using the Gunn diode in accordance with the present invention, uses the negative resistance characteristics of the Gunn diode.

The amplifier using the Gunn diode of the present invention accomplishes the amplification effect by maintaining the characteristic reflection coefficient of the Gunn diode's negative resistance as above 1.

The amplifier of the present invention using the Gunn diode widens the bandwidth of the amplified frequencies, by installing at least one additional resonance point around the originally designed resonance point.

The said additional resonance point is located in the non-radiative dielectric waveguide which connects the Gunn diode and the circulator.

Figure 1:
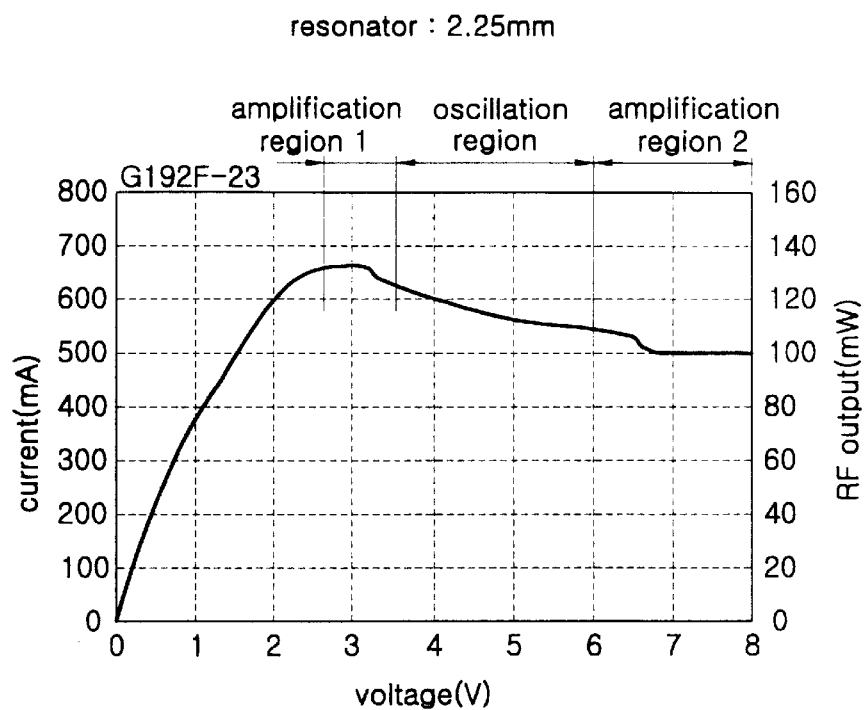
FIG. 1 is a graph showing the amplification area and the oscillation area of an ordinary Gunn diode.
Figure 2:
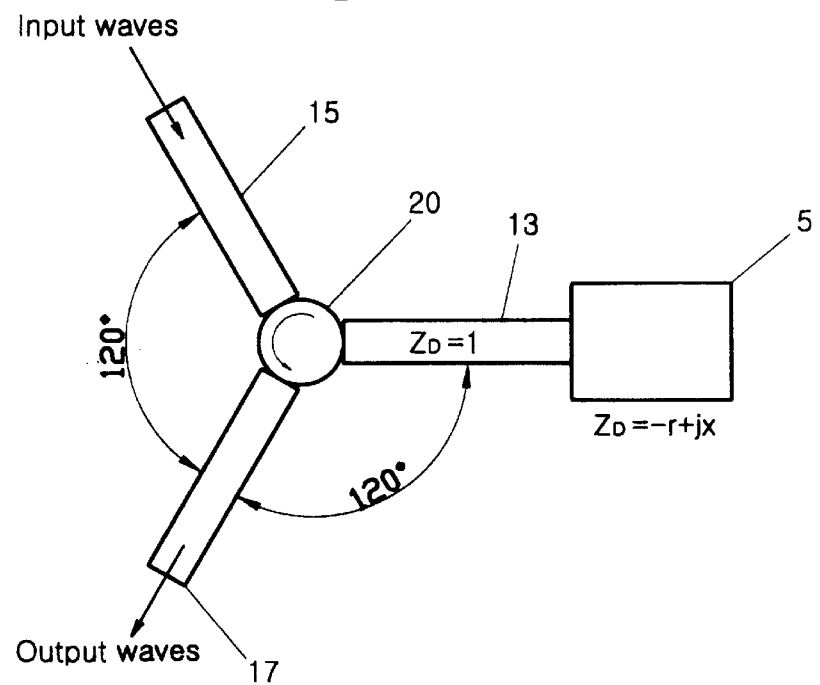
FIG. 2 is a structure diagram of an amplifier using the Gunn diode of the present invention.

As illustrated in FIG. 2, in the multi-space structure amplifier of the present invention, input waves enter the circulator(20) through the first non-radiative dielectric waveguide(15). Then the circulator(20), by revolving, determines the direction to send the input waves. The input waves, through the next transmission line which is the second non-radiative dielectric waveguide(13), are sent to the Gunn diode(5). In the Gunn diode, where the reflected waves are amplified from the input waves by the characteristics of the negative resistance, the input waves are amplified by a certain number of times. Such amplified waves are sent to the circulator(20) through the second non-radiative dielectric waveguide(13). The circulator(20), by revolving, determines the transmission port for the amplified signals and outputs the reflected waves to the determined port, the load side, through the third non-radiative dielectric waveguide(17).

In FIG. 2, if $Z_D$ is the impedance of the Gunn diode(5), standardized at the characteristic impedance of the transmission line, such impedance of the Gunn diode(5) may be represented by a serial circuit of the negative resistance r and the reactance jx.

Here, the reflection coefficient $r_N$ may be defined as in the following equation 1.

$$r_N = \left| \frac{1 + r - jx}{1 - r + jx} \right| \quad \text{[Equation 1]}$$

In order to simplify the equation, if we substitute 0 for the value of the reactance jx, the reflection coefficient at the central frequency of the amplifier is defined as in the following equation 2.

$$r_N = \left| \frac{1 + r}{1 - r} \right| > 1 \quad \text{[Equation 2]}$$

In the above equation 2, if the reflection coefficient is greater than 1, the reflected waves will become larger than the incident waves, causing amplification. Because the reflection coefficient is the ratio of the reflection power to the input power, it is the same as the definition of the gain. Therefore, the power gain is defined as in the following equation 3.

$$G_p = |r_N|^2 \quad \text{[Equation 3]}$$

The above equation 3 shows that the amplification gain increases as the value of the negative resistance of the Gunn diode(5) approaches the characteristic impedance of the transmission line. If the negative resistance value is 1, the reflection coefficient will have the value of infinity and, thus, even when there is no incident waves, output waves will exist, causing the oscillation.

As a result, the frequency characteristics of the amplifier's gain in the above equation 1 will have the shape of a simple peak reaching the top at a frequency where the Gunn diode's reactance becomes 0.

On the other hand, the size of the non-radiative dielectric waveguide may be determined by the following equations 4 and 5.

$$\frac{a}{\lambda} \approx 0.45 \quad \text{[Equation 4]}$$

$$\frac{\sqrt{\varepsilon_r - 1}b}{\lambda} \approx 0.4 \sim 0.6 \quad \text{[Equation 5]}$$

In the above equations, $\varepsilon_r$ is the dielectric constant and $\lambda$ is the wavelength.

Ordinarily, the size of the Gunn diode(5) must fit the space between two metal plates(1,3), where the non-radiative dielectric waveguides(13, 15, 17) are located. The size of diode mounts(10) differs by manufacturers and the frequencies actually used also vary by usage or purposes. That a different frequency is used means that the space between two metal plates(1,3) needs to be changed. Thus, it is impracticable to obtain diodes of a size that fits the frequency to be used.

Therefore, in the present invention, an amplifier in the multi-space structure non-radiative dielectric waveguide is provided. In such amplifier, the Gunn diode(5) and the non-radiative dielectric waveguides(13, 15, 17) for input and output of amplified signals are installed in the space between two metal plates(1,3), and multiple spaces are created in between the metal plates(1,3) for various frequencies to be amplified.

Not only a high frequency Gunn diode, but also a low frequency Gunn diode may be used in the present invention. In such case, a low frequency Gunn diode is installed between two metal plates where the space between which plates is large, and dielectric transmission lines for two-times or three-times multiplied frequency are installed in a smaller space between metal plates. A strip resonator or a reed type resonator, which resonates at the multiplied frequency, is placed so that it may connect the diode and the waveguide, amplifying the reflected waves using the harmonic negative resistance characteristics.

The above-described objects, features and the advantages of the present invention will become clearer through the following detailed description of the present invention, made with reference to the attached drawings. The following is the detailed description of the preferred embodiments of the present invention.

Figure 3:
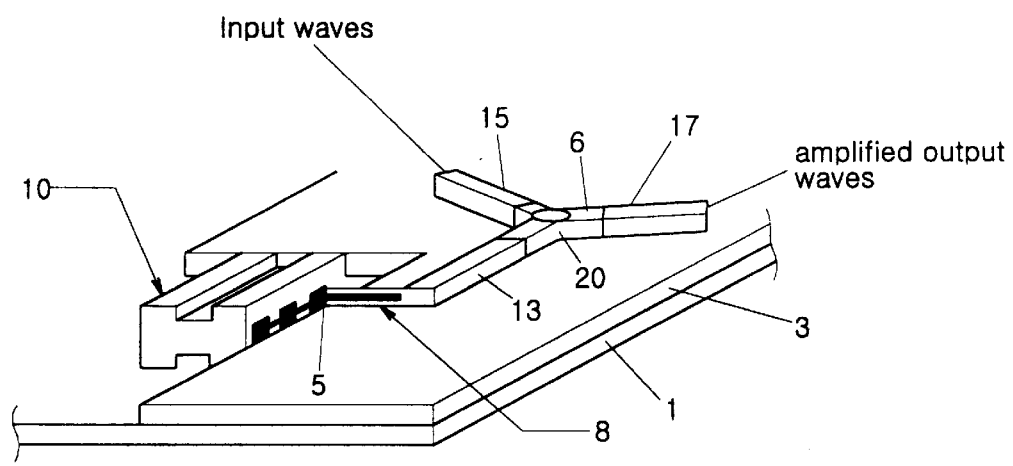
FIG. 3 is a partial cross-sectional diagram of the multi-space structure amplifier of the present invention.

FIG. 3 is a partial cross-sectional diagram of the multi-space structure amplifier of the present invention.

As illustrated in FIG. 3, the input waves are sent to the circulator(20) through the first non-radiative dielectric waveguide. After the transmission direction is determined through the revolution of the circulator(20), such input waves enter the Gunn diode through the second non-radiative dielectric waveguide(13). In the Gunn diode(5), the amplification ratio to a multiplied frequency is determined by the negative resistance characteristics. Here, because the reflected output waves are larger than the input waves, the ratio of the output waves to the input waves is the amplification ratio. The amplified waves multiplied in the Gunn diode(5) are sent to the circulator(20) through the second non-radiative dielectric waveguide(13). After the transmission direction is determined through the circulator(20)'s revolution, such waves are outputted as reflected waves to the load side through the non-radiative dielectric waveguide (17).

The base supporting the said Gunn diode(5) and the diode mount(10) comprises metal plates of a size fitting the sizes of the Gunn diode and the diode mount(10) and metal plates, the spaces between which metal plates correspond to frequencies to be used. Such base is constructed to have the multi-space structure.

Through the present invention, we may construct an amplifier using a Gunn diode(5) of a same size, which generates various frequencies according to their usage.

The sizes of the non-radiative dielectric waveguides(13, 15, 17) are determined by equations 4 and 5 in accordance with frequencies to be used, and in the same manner, the spaces between metal plates forming the non-radiative dielectric waveguides(13, 15, 17) are determined. However, because the sizes of the diode mounts(10) are different by the manufacturers, the multi-space structures are used to construct a circuit with elements of various different sizes.

Here, the connection between the Gunn diode(5) and the non-radiative dielectric waveguide(13) is made by the strip resonator(8), the length of the metal portion of which resonator determines the frequency to be used.

If the length of the metal plate is longer than a half the wavelength of the frequency to be used, the frequency becomes lower, and if the length is shorter, then the resonance frequency becomes higher.

Because there may arise unwanted modes in the connection area of the circulator, the mode suppressor(6) is inserted in the connection area between the non-radiative dielectric waveguides(13, 15, 17) and the circulator(20).

When the bias voltage needs to be supplied to the amplifier described above, such voltage is supplied to Amplification Area 2, because Amplification Area 2 has better amplification characteristics and is more stable than Amplification Area 1.

Figure 4:
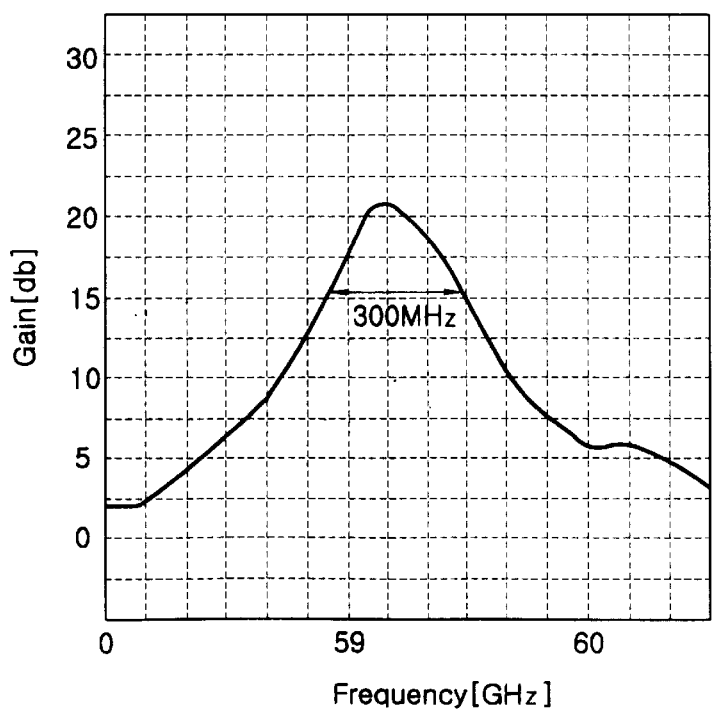
FIG. 4 is a graph showing the frequency characteristics of the multi-space structure amplifier of the present invention.

FIG. 4 is a graph showing the frequency characteristics of the Gunn diode amplifier of the present invention.

The Gunn diode amplifier of the present invention has the gain of 13 dB if it uses Amplification Area 1, but if Amplification Area 2 is used, the Gunn diode amplifier will have the high gain of 24 dB as shown in FIG. 4.

The change in gain for the bias voltage change of 1 mV is 0.203 dB/mV in Amplification Area 1, but such change in gain is 0.038 dB/mV in Amplification Area 2. Thus, Amplification Area 2 shows less change in gain.

Figure 5:
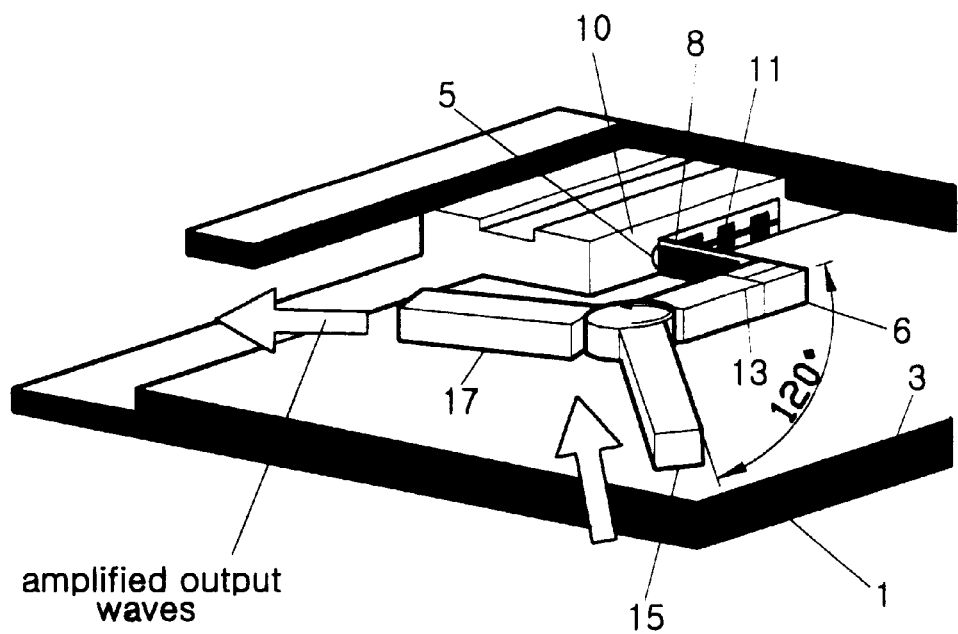
FIG. 5 is a partial cross-sectional diagram illustrating another embodiment of the multi-space structure amplifier of the present invention.

FIG. 5 is a partial cross-sectional diagram illustrating another embodiment of the amplifier of the present invention.

If it is difficult to obtain a Gunn diode for high frequency when high frequencies are used because of large amount of transmission data, a Gunn diode for low frequency may be used to construct an amplifier for a high frequency. In the multi-space non-radiative dielectric waveguide structure as illustrated in FIG. 5, the bias voltage may be supplied to the large space between metal plates(1) for low frequency level, through the Gunn diode(5) for low frequency. The non-radiative dielectric waveguides(13, 15, 17) for a frequency of two or three multiples of the Gunn diode oscillation frequency may be located in the smaller space between metal plates. Between the Gunn diode and the non-radiative dielectric waveguides placed a strip resonator(8) or a reed type resonator, which resonates at a multiplied frequency. In this manner, the reflected waves may be amplified by the negative resistance characteristics using the harmonics.

Thus, a frequency multiplying amplifier in the multi-space structure dielectric waveguides may be constructed for frequencies that are two or three times higher than Gunn diode's frequency.

Also, as another embodiment of the present invention, one additional resonance point in addition to the original resonance point may be inserted in order to widen the bandwidth of the amplified frequency with multiple resonance points. The following is the detailed description of such amplifier.

As one of the amplification characteristics, the frequency resonance of a certain band is set in accordance with selection of the non-radiative dielectric waveguides and elements. Thus, as shown in the equivalent circuit of the amplifier of FIG. 6, a certain frequency resonates in accordance with the values of L1 and C1. If another resonance point with L1 and C1 is constructed and located close to the original resonance point with L1 and C1, the entire amplification characteristics will include both resonance points, constituting an amplifier with a broader bandwidth than an amplifier only with one original resonance point.

Figure 6:
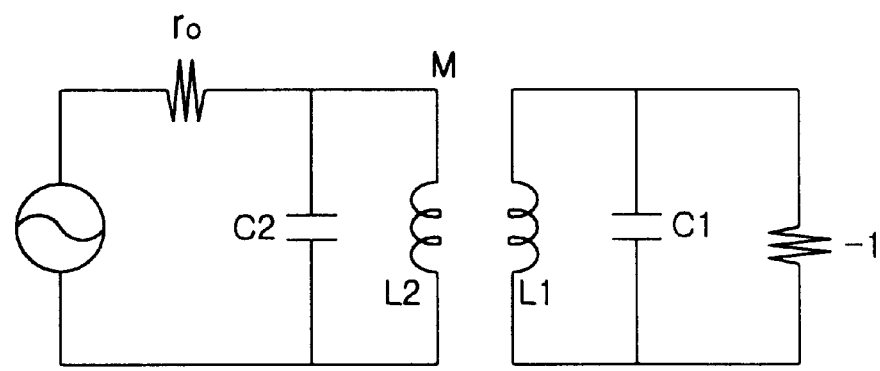
FIG. 6 is an equivalent circuit diagram of a circuit with an additional resonator for implementing another embodiment of the multi-space structure amplifier of the present invention.
Figure 7:
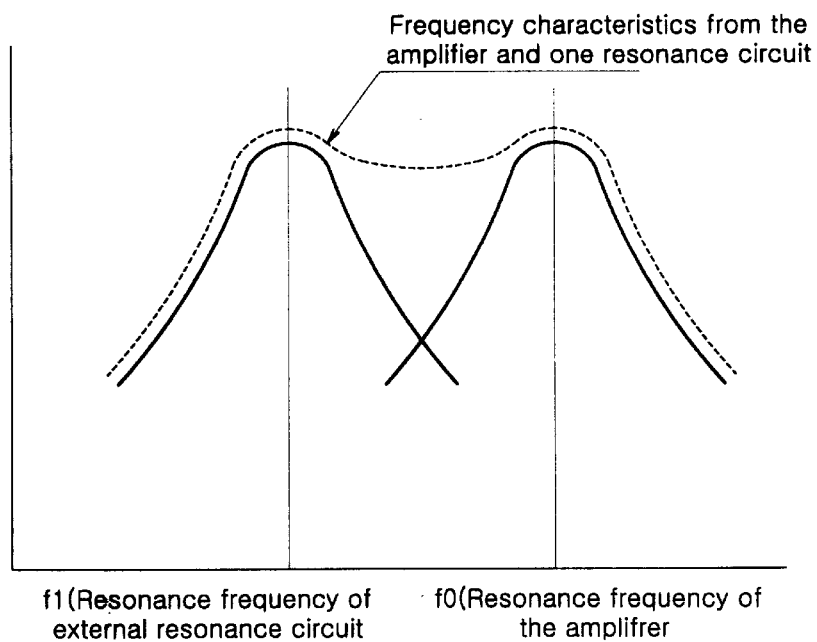
FIG. 7 is a graph illustrating the frequency characteristics of a broadband amplifier designed with one external resonance point.

In this manner, if we add one additional resonance circuit to the original resonance circuit to construct a composition circuit, and have the resonance frequency of the additional resonance circuit to be slightly different from that of the original one (as illustrated in FIG. 6), then we can obtain an amplifier with a broadened amplification bandwidth as shown in FIG. 7.

Figure 8:
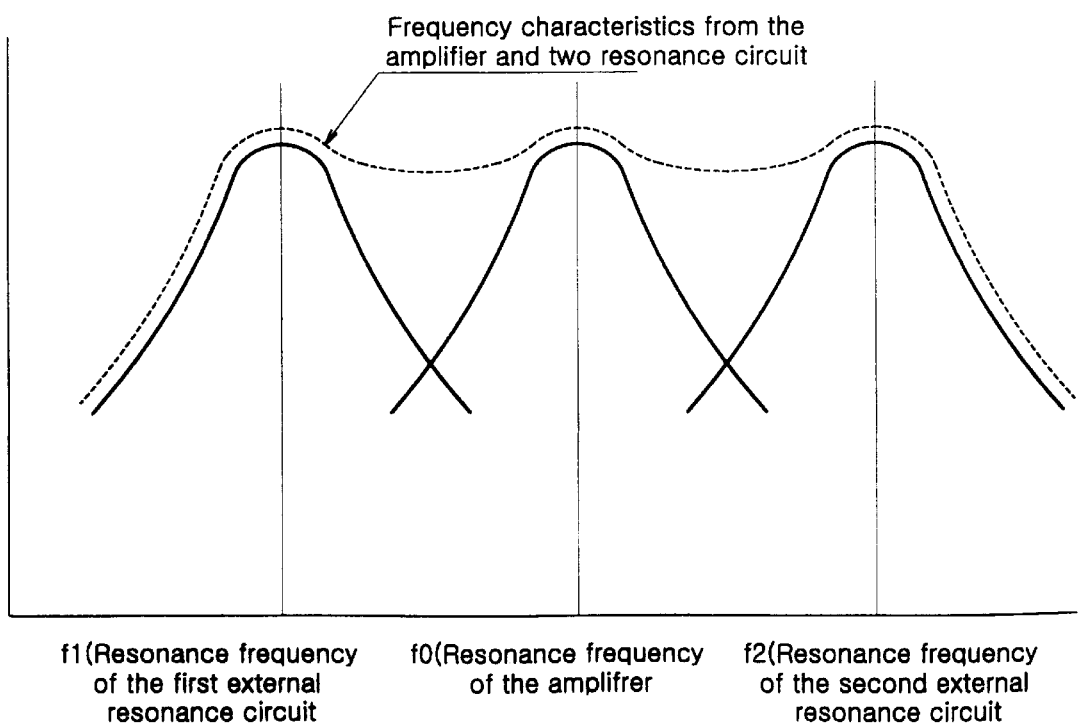
FIG. 8 is a graph illustrating the frequency characteristics of a broadband amplifier designed with two external resonance points.

In the same manner, if we insert two external resonance circuits to make the amplifier have three resonance points and obtain a broad and spread resonance frequency characteristics as shown in FIG. 8.

The principle of constructing an amplifier with a broadened frequency characteristic using external resonance circuits of the non-radiative dielectric waveguide blocks is as follows.

Figure 9:
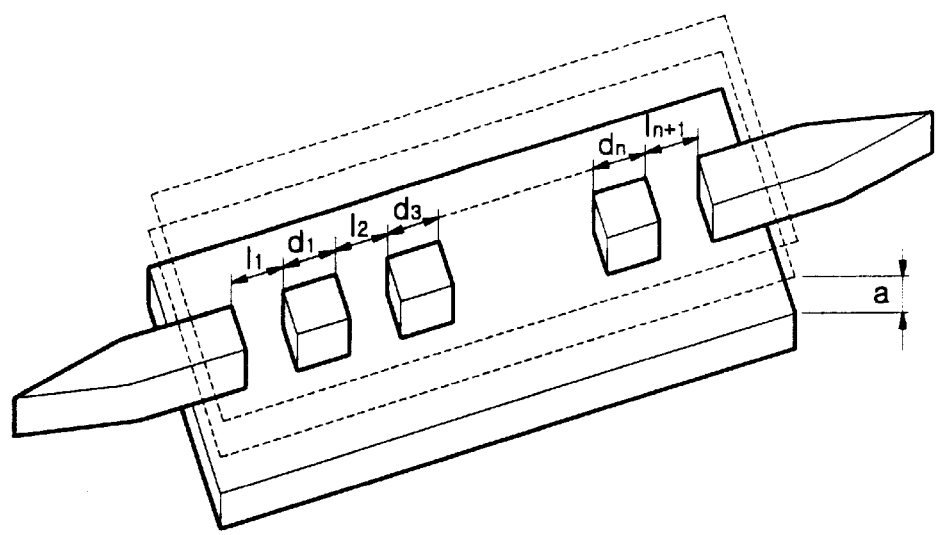
FIG. 9 is a partial cross-sectional diagram of a resonator installed in the non-radiative dielectric waveguides in another embodiment of the present invention.

A resonance circuit using the non-radiative dielectric waveguide blocks in accordance with an embodiment of the present invention may be constituted as shown in FIG. 9.

First, a multi-step resonator may be built using the non-radiative dielectric waveguide blocks as shown in FIG. 9. In this basic structure, in order to obtain the values of 11, d1, and 12, the resonance circuit of FIG. 9 is converted into an equivalent circuit of FIG. 10 and then interpreted.

Here, the symmetrical T type circuits represent the attenuation areas, $\eta^D$ represents the line's characteristic impedance, $x_{pj}, x_{sj}(j=1\sim n+1)$ are the impedances of the serial and parallel arms of the attenuation areas, represented as a function of $1_j$.

Figure 10:
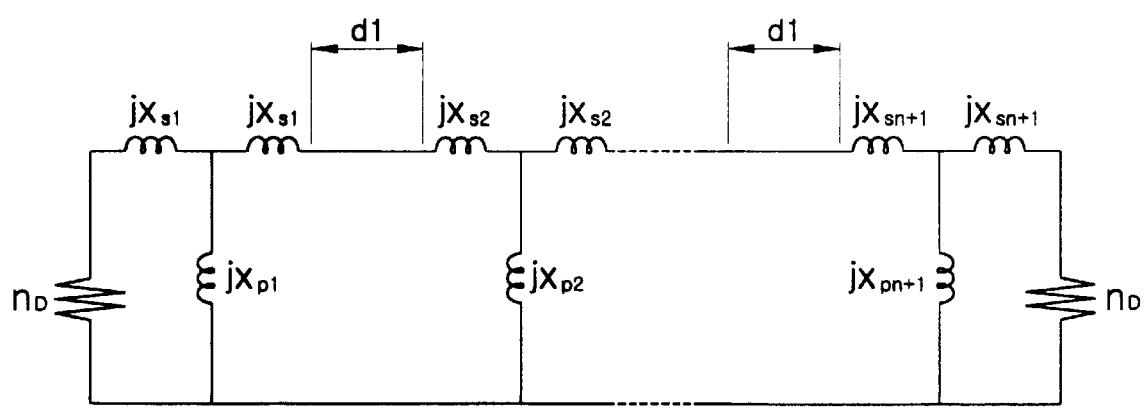
FIG. 10 is an equivalent circuit diagram of a resonance circuit installed on the non-radiative dielectric waveguides of FIG. 9.
Figure 11:
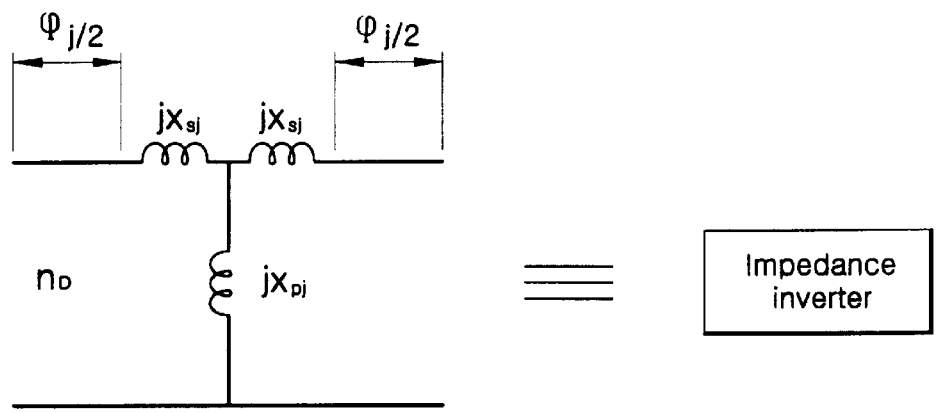
FIG. 11 is a diagram illustrating the T type circuit of FIG. 10, with an impedance inverter circuit.
Figure 12:
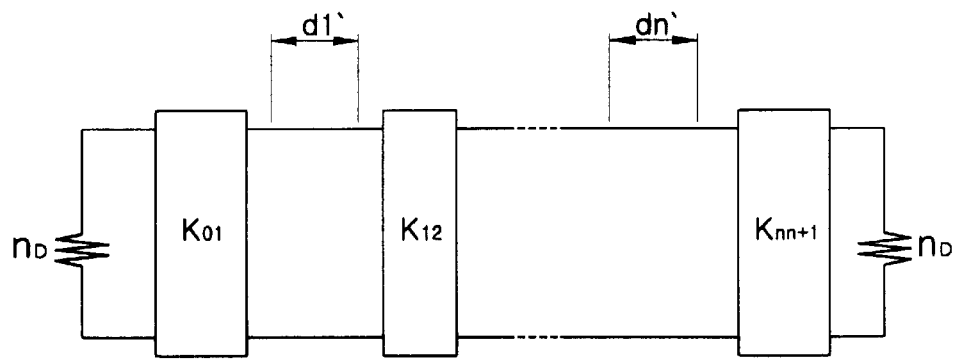
FIG. 12 is an equivalent circuit diagram using an inverter for the resonance circuit on the non-radiative dielectric waveguides of FIG. 9.

If we convert the T type circuit portion into an impedance inverter circuit as illustrated in FIG. 11, the equivalent circuit of FIG. 10 may be represented as the equivalent circuit of FIG. 12.

The lengths of the resonator in FIG. 10, $d_j(j=1\sim n)$ are $x_{pj}$, $x_{sj}, x_{pj}+1$, and $x_{sj}+1$ of the impedances at both sides, which are represented with a phase constant β and defined with the following equations 6 and 7.

$$k_{j-1\,j} = H_D \tan\left(\frac{\phi_j}{2} + \tan^{-1}\frac{x_{sj}}{H_D}\right) \quad \text{[Equation 6]}$$

$$\phi_j = -\tan^{-1}\left(\frac{2x_{pj}}{H_D} + \frac{x_{sj}}{H_D}\right) - \tan^{-1}\frac{x_{sj}}{H_D} \quad \text{[Equation 7]}$$

Thus, using the design formulas in the following equations of 8 and 9, multiple resonance circuits may be designed and constructed from the dielectric blocks.

$$\omega_\lambda = \left(\frac{\lambda_{g0}}{\lambda_0}\right)^2 \frac{\Delta f}{f_0} \qquad \text{[Equation 8]}$$

$$d_j = \frac{1}{\beta}\left\{m\pi - \frac{1}{2}\left(\tan^{-1}\frac{2x_{pj}+x_{sj}}{H_D} + \tan^{-1}\frac{x_{sj}}{H_D} + \tan^{-1}\frac{2x_{pj+1}+x_{sj+1}}{H_D} - \tan^{-1}\frac{x_{sj+1}}{H_D}\right)\right\} \qquad \text{[Equation 9]}$$

$f_0$: Mean frequency $\Delta f$: Band
$\lambda_{go}$: Wavelength in the waveguide at $f_0$
$\lambda_0$: Free space wavelength at f0
$H_D$: Load impedance The above-described objects, features, and advantages will become clearer through the following detailed description provided with the attached drawings.

The following is the detailed description of the embodiments of the present invention provided with reference to the attached drawings.

Figure 13:
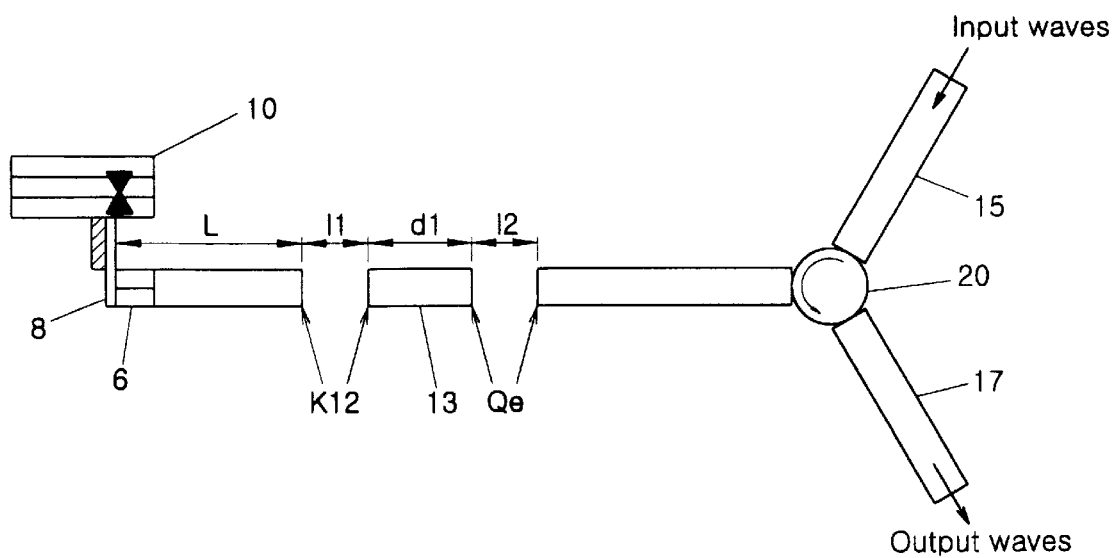
FIG. 13 is a circuit diagram of a broadband amplifier with one additional external resonator in accordance with another embodiment of the present invention.

FIG. 13 is a diagram illustrating an amplifier with one additional external resonator in accordance with another embodiment of the present invention.

FIG. 13 is a broadband amplifier implemented through a resonance circuit using the Gunn diode amplifier(5) and one external non-radiative dielectric waveguide(13).

In the present invention, the Gunn diode(5) is installed in a space of a certain predetermined size between two metal plates. Input waves from the first non-radiative dielectric waveguide(15), after revolution in the circulator(20) and determination of the transmission direction, are sent to the said Gunn diode(5) through the second non-radiative dielectric waveguide(13). The waves are amplified in the said Gunn diode(5) and the transmission direction is determined after the revolution in the circulator(20), then the output waves are transmitted through the third non-radiative dielectric waveguide(17).

A strip resonator(8) connecting the said Gunn diode(5) and the second non-radiative dielectric waveguide(13) is installed in between them. At the connection area of the second non-radiative dielectric waveguide(13) and the strip resonator(8) is inserted a mode suppressor(6).

The first non-radiative dielectric waveguide(15) transmits the input waves from the input terminal to the circulator(20) and the third non-radiative dielectric waveguide(17), which is connected to said circulator(20), transmits the waves amplified in the Gunn diode to the output port.

As shown in FIG. 13, the input waves coming from the first non-radiative dielectric waveguide(15) are inputted to the Gunn diode(5) through the second non-radiative dielectric waveguide(13), after the direction to transmit is determined by the revolution in the circulator(20). In the Gunn diode(5), the input waves are amplified with the predetermined level and outputted as reflected waves. Such amplified reflected waves are outputted through the second non-radiative dielectric waveguide(13) and amplified to become broadband signals through the overlay of resonance points caused by one or more resonance circuits(11, 12) on the second non-radiative dielectric waveguide(13), and then are transmitted to the circulator(20).

The circulator(20) then revolves the reflected waves, which were inputted as amplified broadband signals, to determine the direction to transmit such signals and transmits the waves to the lead side through the third non-radiative dielectric waveguide(17).

If the sizes of the Gunn diode(5) and the mount(10) do not fit the second non-radiative dielectric waveguide(13), the multi-space structure waveguides with large and small spaced metal plates are used.

Figure 14:
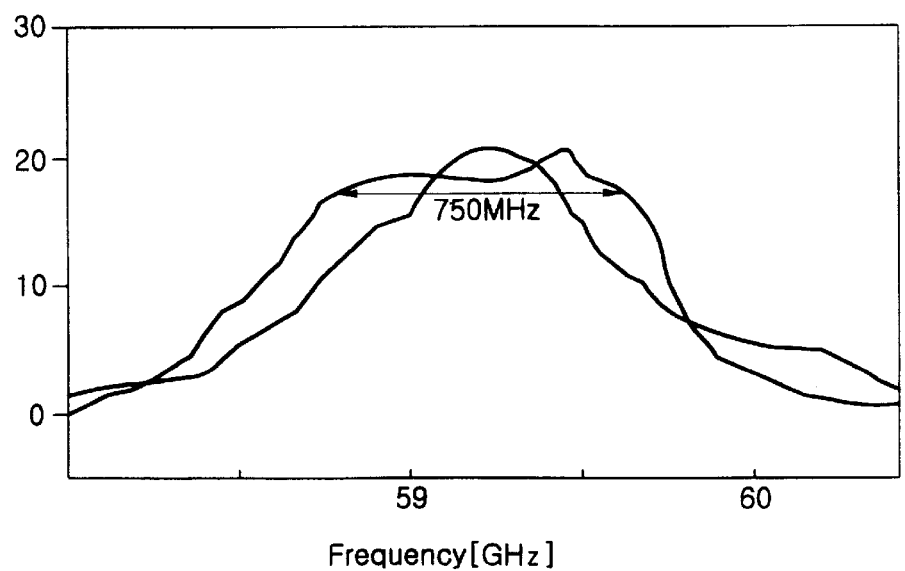
FIG. 14 is a graph illustrating the amplification characteristics of the broadband amplifier of an embodiment of the present invention illustrated in FIG. 13.

If one or more resonance circuits(11, 12) are inserted in the second non-radiative dielectric waveguide(13) to create a broadband frequency through the overlay of resonance points, the frequency will be amplified to have a broad frequency band of approximately 750 MHz as illustrated in the graph of FIG. 14. An amplifier only with the Gunn diode(5) as in FIG. 4 has a pass band of 3000 MHz, but by inserting external resonators, broadband amplification may be accomplished.

On the other hand, if data to be transmitted increase and the frequency to be used gets higher, but if the Gunn diode for high frequency cannot be applied and if it is necessary to conduct the high frequency amplification through the low frequency Gunn diode, the multi-space structure of the present invention may be used. In the multi-space structure, the bias voltage may be applied to the large space between metal plates for low frequency level so that negative resistance characteristics may be created. In the smaller space between the metal plates, a strip resonance circuit or a reed type resonance circuit which oscillates a frequency two or three times higher than that of the oscillation frequency of the Gunn diode is located in the non-radiative dielectric waveguide. In this manner, the reflected waves which are amplified in the Gunn diode through the negative resistance characteristics may be amplified to be a broadband frequency.

As explained above in detail, the present invention has an economic advantage because it constructs an amplifier using a Gunn diode and the multi-space non-radiative dielectric waveguide structure, making it unnecessary to construct many different packages in order to amplify various frequencies.

The present invention, by providing a broadband amplifier with a Gunn diode and dielectric resonance circuits, will contribute to the development of super-high speed broadband communication devices in this multimedia era.

The preferred embodiments of the present invention were provided for the purpose of illustrating the present invention. A person in the relevant art may be able to modify, change or add to certain features of the present invention within the concept and the scope of the present invention and, therefore, such modifications, changes or additions are deemed to be included in the following claims.

What is claimed is:

1. An amplifier circuit with a multi-space structure for high frequency amplification, comprising:

a Gunn diode installed in a space between two metal plates of a certain distance from each other;

a circulator which revolves input waves and determines transmission direction;

a first non-radiative dielectric waveguide which is connected to the circulator, sending the input waves from the input terminal to the circulator;

a second non-radiative dielectric waveguide which also is connected to the circulator, sending the input signals from the circulator to the Gunn diode and sending the amplified signals from the Gunn diode back to the circulator; and a third non-radiative dielectric waveguide which is connected to the circulator, sending the amplified signals, which come into the circulator through the second non-radiative dielectric waveguide, to the output terminal;

wherein the non-radiative dielectric waveguides are installed in a space between two metal plates of different size, forming the multi-space structure.

2. A multi-space structure amplifier according to claim 1, wherein:

a mode suppressor is used for connection of the circulator and the non-radiative dielectric waveguides, to eliminate unwanted modes.

3. A multi-space structure amplifier according to claim 1, wherein:

connection between the Gunn diode and the non-radiative dielectric waveguide is made by a frequency multiplying strip resonator, which resonates at a multiplied frequency of the basic oscillation frequency.

4. A multi-space structure amplifier according to claim 1, wherein:

amplification of the input waves is accomplished by using negative resistance characteristics of the Gunn diode; and the reflection coefficient of the negative resistance characteristics of the Gurn diode is greater than 1.

5. A multi-space structure amplifier for broadband amplification, comprising:

a Gunn diode inserted in a space between two metal plates of a certain distance from each other;

a circulator which revolves input waves and determines transmission direction;

a first non-radiative dielectric waveguide which is connected to the circulator, sending the input waves from the input terminal to the circulator;

a second non-radiative dielectric waveguide which also is connected to the circulator and equipped with multiple blocks of resonance circuits, sending the input signals from the circulator to the Gunn diode and sending the amplified signals from the Gunn diode back to the circulator;

a third non-radiative dielectric waveguide which is connected to the circulator, sending the amplified signals, which come into the circulator, to the output terminal; and a strip resonator connecting the Gunn diode and the second non-radiative dielectric waveguide.

6. A multi-space structure amplifier according to claim 5, wherein:

the resonance circuit installed in the second non-radiative dielectric waveguide implements one or more resonance points around the basic resonance point to create the overlay of the resonance frequencies.

* * * * *